United States Patent
Chadda et al.

(10) Patent No.: US 9,318,466 B2
(45) Date of Patent: Apr. 19, 2016

(54) METHOD FOR ELECTRONIC CIRCUIT ASSEMBLY ON A PAPER SUBSTRATE

(71) Applicant: GLOBALFOUNDRIES Inc., Grand Cayman (KY)

(72) Inventors: Saket Chadda, San Jose, CA (US); Ramakanth Alapati, Rexford, NY (US); Adam Beece, Ballston Spa, NY (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 14/471,620

(22) Filed: Aug. 28, 2014

(65) Prior Publication Data

US 2016/0064354 A1    Mar. 3, 2016

(51) Int. Cl.
*H01L 25/00* (2006.01)
*H01L 25/065* (2006.01)

(52) U.S. Cl.
CPC ............ *H01L 25/0652* (2013.01); *H01L 25/50* (2013.01); *H01L 2225/06517* (2013.01); *H01L 2225/06524* (2013.01); *H01L 2225/06548* (2013.01); *H01L 2225/06589* (2013.01)

(58) Field of Classification Search
None
See application file for complete search history.

(56) References Cited

U.S. PATENT DOCUMENTS

| | | | | |
|---|---|---|---|---|
| 2003/0135997 | A1* | 7/2003 | Watanabe | H01L 21/76898 29/852 |
| 2004/0195669 | A1* | 10/2004 | Wilkins | B81B 7/0006 257/698 |
| 2009/0146295 | A1* | 6/2009 | Narita | H01L 23/3677 257/720 |
| 2013/0113108 | A1* | 5/2013 | Wang | H01L 21/563 257/772 |
| 2014/0035935 | A1* | 2/2014 | Shenoy | H01L 23/15 345/501 |
| 2014/0217604 | A1* | 8/2014 | Chou | H01L 24/11 257/774 |
| 2014/0306350 | A1* | 10/2014 | Urruti | H01L 21/76802 257/774 |

\* cited by examiner

*Primary Examiner* — Marc Armand
*Assistant Examiner* — Younes Boulghassoul
(74) *Attorney, Agent, or Firm* — Ditthavong & Steiner, P.C.

(57) ABSTRACT

A methodology for a thin, flexible substrate having integrated passive circuit elements, and the resulting device are disclosed. Embodiments may include integrating one or more passive circuit components on a first or second surface of a substrate, and interconnecting one or more integrated circuit (IC) dies on a second surface of the interposer to the one or more passive circuit components with one or more metal-filled vias between the first and second surfaces, the first and second surfaces being opposite surfaces of the substrate.

10 Claims, 9 Drawing Sheets

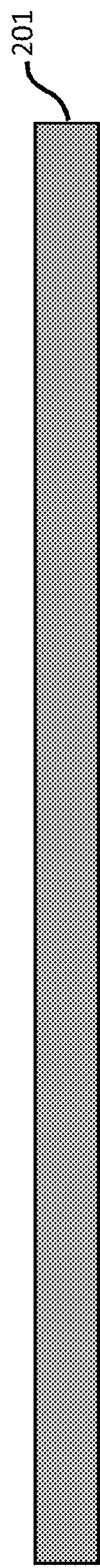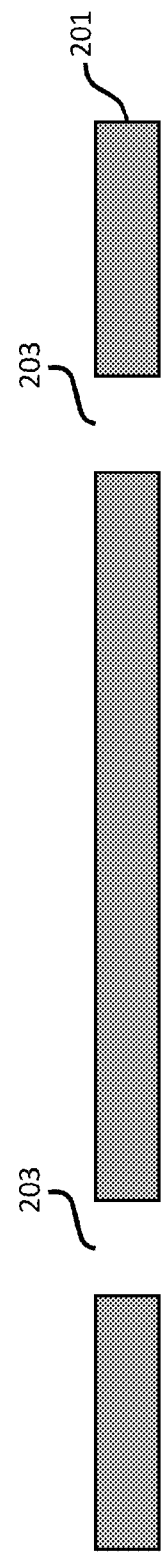

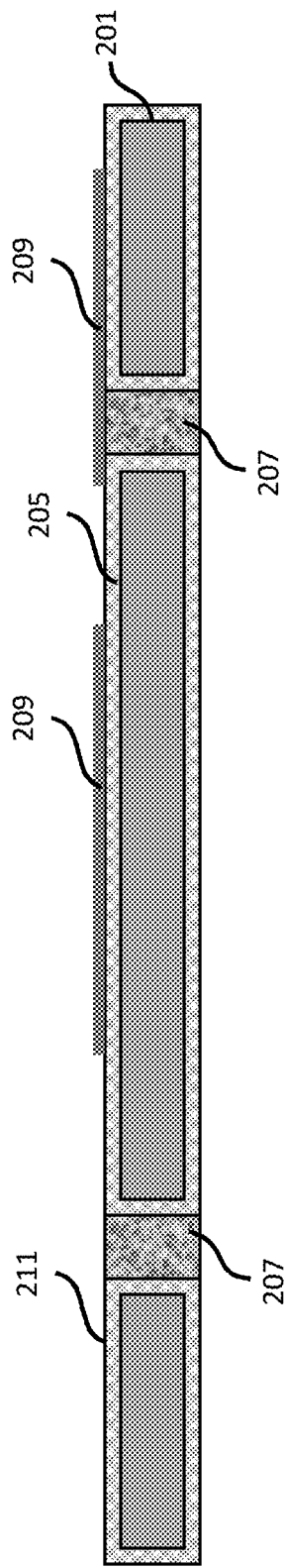
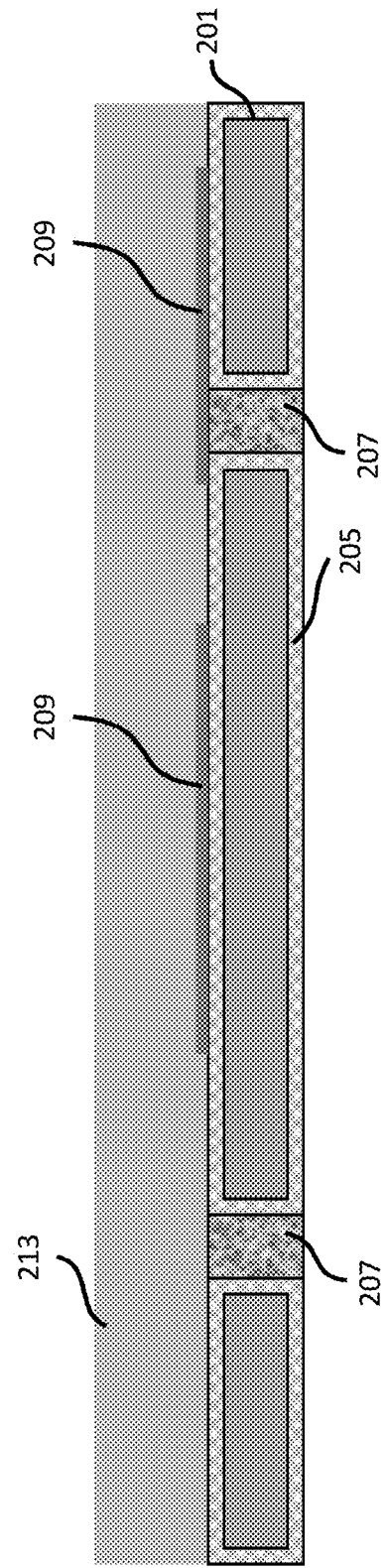
FIG. 2E
FIG. 2F

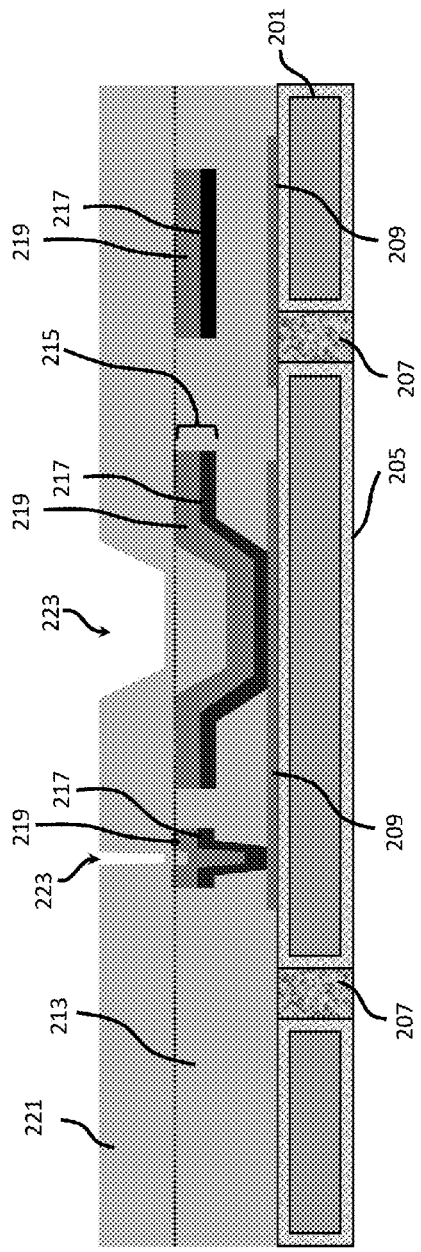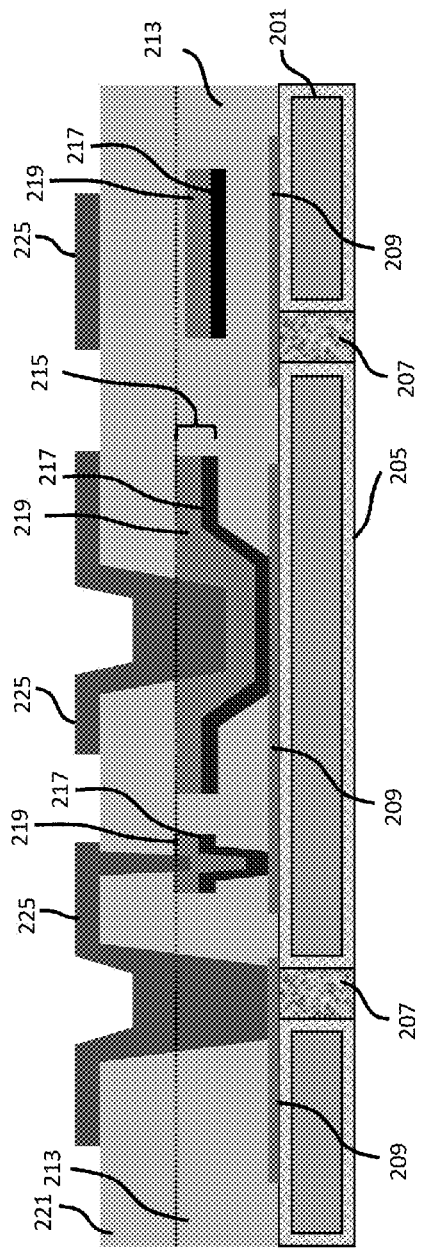

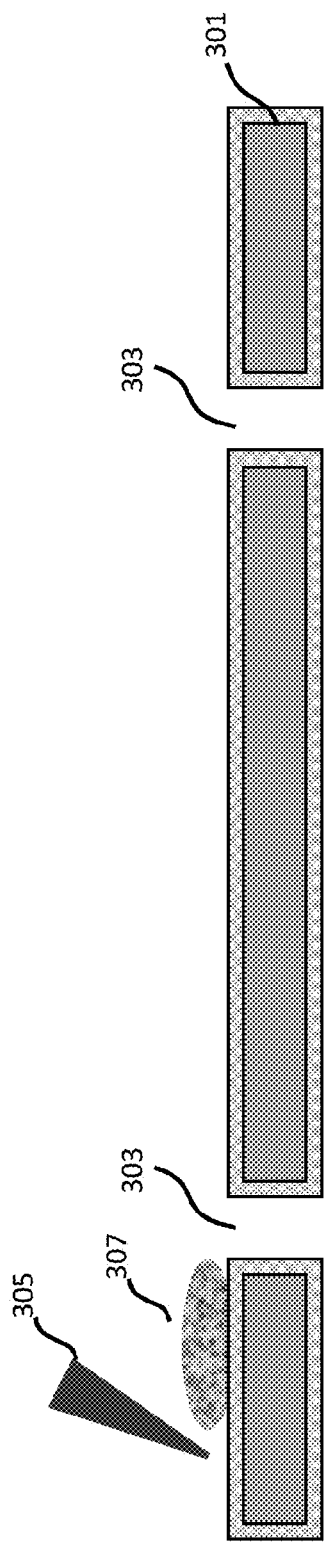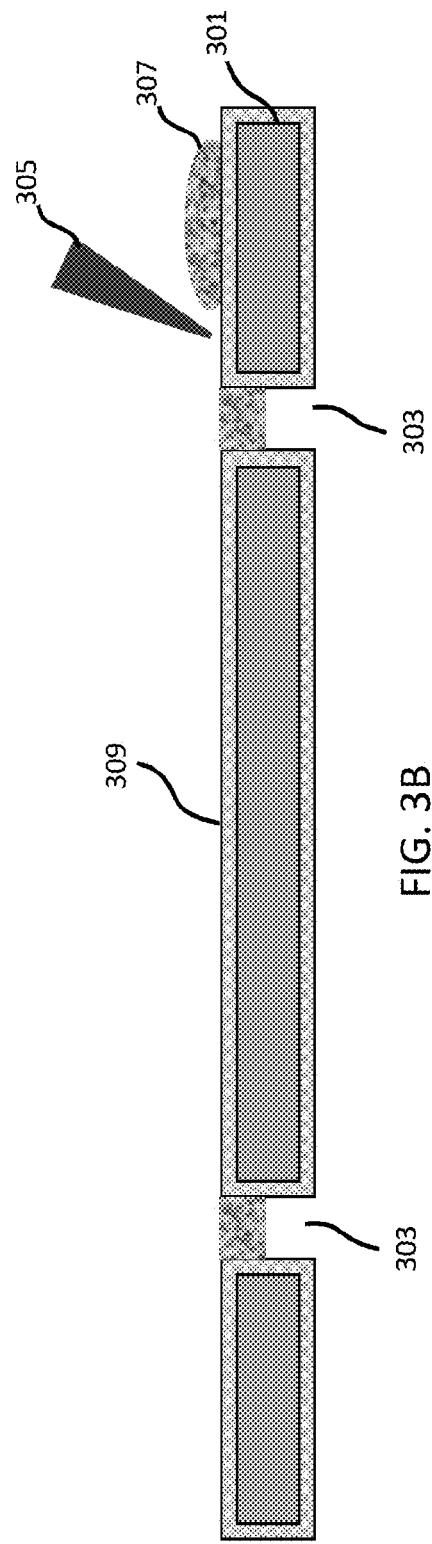
FIG. 3A
FIG. 3B

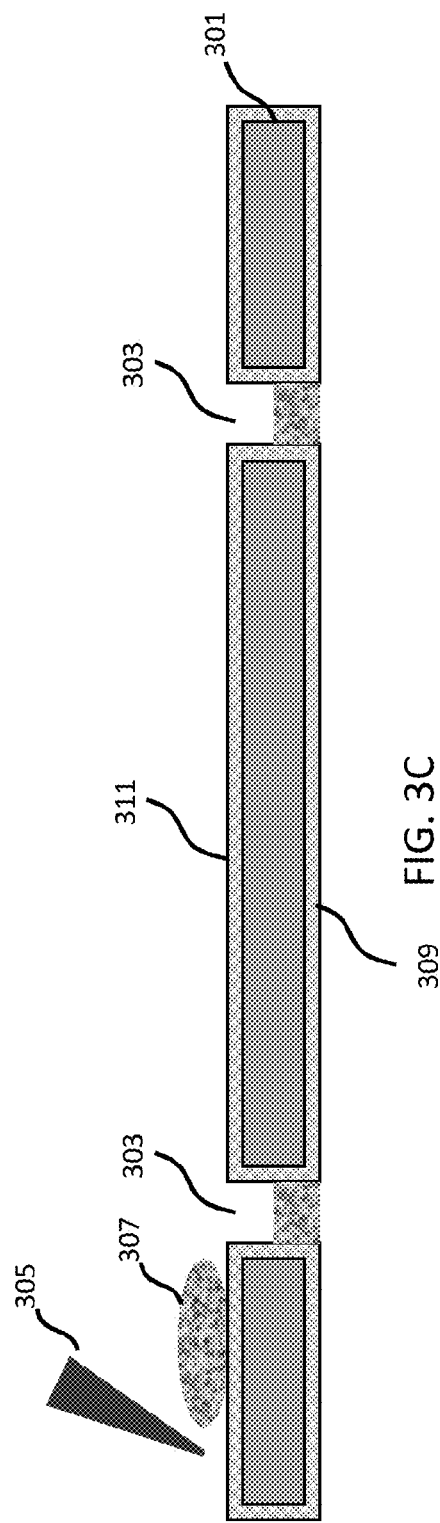
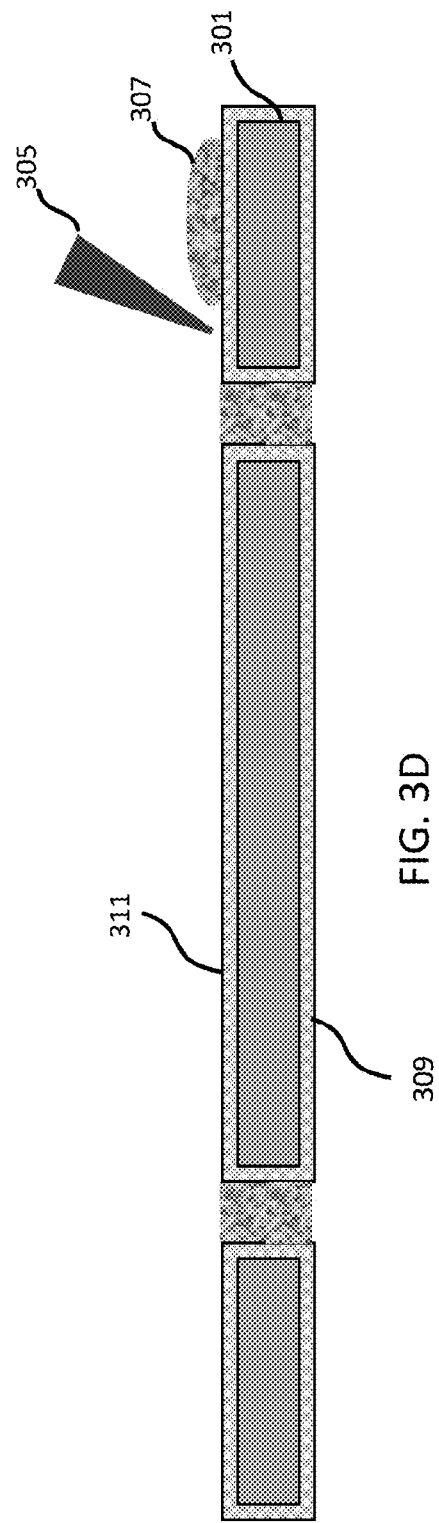
FIG. 3C
FIG. 3D

METHOD FOR ELECTRONIC CIRCUIT ASSEMBLY ON A PAPER SUBSTRATE

TECHNICAL FIELD

The present disclosure relates to the assembly and packaging of electronic devices. More particularly, the present disclosure relates to an interposer assembly used in 2.5D and 3D surface-mount and packaging of integrated circuit (IC) dies.

BACKGROUND

Wearable devices and devices interconnected via the emerging Internet of Things (IOTs) are currently made with surface-mount technology developed for the desktop computer and refined for mobile electronic systems (e.g., mobile phones, tablets, etc.). For instance, such technology typically utilizes FR4-based Printed Circuit Board (PCB) substrates that include multiple layers of electrical routing interconnect. FR4 is a grade designation assigned to glass-reinforced epoxy laminate sheets and PCBs. It is a composite material composed of woven fiberglass cloth with an epoxy resin binder that is Flame Resistant. Semiconductor chips are mounted on the substrate along with other discrete passive devices (e.g., resistors, capacitors).

Wearable devices should preferably be compact, light, reliable, and inexpensive. FR4-based PCB assemblies are typically 1.5-2.5 millimeters (mm) thick, are rigid, and have a large surface area. So-called "flex" or "rigid-flex" polyimide-based substrates offer greater flexibility than FR4-based PCB, but are costly and utilize the surface-area of the substrate inefficiently. FIG. 1A illustrates a wearable device utilizing a conventional flex PCB substrate. For example, substrate 101 may be a flex polyimide-based substrate that includes a surface-mounted microprocessor 103 that is interconnected to surface-mounted passive device 105. However, such flexible circuits typically made from polyimide have limited use are thicker than 200 microns (μm) and can only provide electrical traces and do not replace the PCBA.

Multi-chip packaging requires an interposer substrate to connect a memory chip stack to logic chips. Typically, the memory and logic chips are on opposite sides of a thin interposer substrate composed of silicon (Si). FIG. 1B schematically illustrates a conventional 3D multi-chip packaging. As shown, IC die 111 is mounted on substrate 113 at solder balls 115. Stacked memory chips 117 are interconnected by trans-silicon vias (TSV) 119 and are mounted on logic chip 121. Interposer 123 interconnects IC die 111 to logic chip 121.

Desirable characteristics of the interposer include excellent signal integrity, high reliability, and low cost. Si-based interposers are costly and also suffer from reliability issues at thicknesses smaller than 250 μm. Alternatives such as glass have been proposed, but these also suffer from reliability issues particularly due to their fragility at small thicknesses. Furthermore, technology roadmaps related to chip packaging require integration of passive circuit elements (e.g., resistors, capacitors) into interposers.

A need therefore exists for a methodology enabling incorporation of small area, thin, light, cost-efficient, reliable, and robust Circuit Board Assemblies (CBAs) in wearable devices, IOT-interconnected devices, as well as interposers used in 2.5D/3D packaging markets, and the resulting devices.

SUMMARY

An aspect of the present disclosure is the use of an interposer material with a coefficient of thermal expansion (CTE) matching that of Si.

Another aspect of the present disclosure is the use of passive circuit components integrated in a carbon or metal-based substrate that is different from Si.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: integrating one or more passive circuit components on a first surface of a substrate, interconnecting one or more IC dies on the first surface or a second surface of the substrate to the one or more passive circuit components with one or more metal-filled vias between the first and second surfaces, the first and second surfaces being opposite surfaces of the substrate.

Aspects of the present disclosure include forming the substrate from a carbon-based or metal-based material different from Si and FR4 and which has a CTE matched to that of Si. Further aspects include the substrate having a CTE from 1 to 11 ppm/° C. Additional aspects include forming the substrate by depositing alumina or a multilayer dielectric that has low permeability to oxygen and moisture on a paper substrate, by atomic layer deposition (ALD). Further aspects include forming the substrate from NILO® alloy 42, Invar®, Kovar®, other nickel-iron (Ni—Fe) alloys, titanium (Ti) alloys, chromium (Cr), tungsten (W), high chromium iron, aluminum (Al), stainless steel, or paper and which has a thickness from 25 to 300 microns (μm). Additional aspects include forming the substrate by forming one or more openings in the substrate, forming a conformal dielectric layer on all exposed surfaces of the substrate, and forming the one or more metal-filled vias by filling the one or more openings with solder, W, copper (Cu), silver (Ag), Ti, or other metal-based paste. Further aspects include forming the one or more openings by mechanical punching, laser drilling, or chemical etching. Additional aspects include filling the openings by performing a first squeegee operation over the first surface of the substrate, and performing a second squeegee operation over the second surface of the substrate, the openings in the substrate being utilized as a stencil. Further aspects include integrating the one or more passive circuit components on the first surface of the substrate by patterning a metal layer formed on the first surface of the substrate, forming an insulating layer on the patterned metal layer and on exposed surfaces of the first surface of the substrate, and forming the one or more passive circuit components in the insulating layer at the patterned metal layer. Additional aspects include mounting the one or more IC dies on the first or second surface of the substrate using one or more solder balls at the one or more metal-filled vias.

Another aspect of the present disclosure is a device including one or more passive circuit components integrated on a first side of a substrate assembly, and one or more IC dies on the first or a second side of the substrate assembly interconnected to the one or more passive circuit components with one or more metal-filled vias between the first and second sides, the first and second sides being opposite sides of the substrate assembly. Further aspects include a carbon-based or metal-based substrate different from Si and FR4 that has a CTE matched to that of Si. Additional aspects include the carbon-based or metal-based substrate having a CTE from 1 to 11 ppm/° C. Further aspects a paper substrate coated with alumina or a multilayer dielectric that has low permeability to oxygen and moisture. Additional aspects include a substrate formed from NILO® alloy 42, Invar®, Kovar®, other Ni—Fe alloys, Ti alloys, Cr, W, high chromium iron, Al, stainless steel, or paper and having a thickness from 25 to 300 μm. Further aspects include a substrate with one or more openings, and a conformal dielectric layer on all exposed surfaces of the substrate, the one or more metal-filled vias including a solder, W, Cu, Ti, Ag, or other metal-based paste. Additional aspects of the device include a patterned metal layer formed on a first surface of a carbon-based or a metal-based substrate, and an insulating layer formed over the patterned metal layer and the first surface of the carbon-based or metal-based substrate, the one or more passive circuit components being integrated on the first side of the substrate assembly being located in the insulating layer and on the patterned metal layer. Further aspects include the patterned metal layer having a thickness from 100 Angstroms (Å) to 3 μm and being formed to overlap at least one of the one or more metal-filled vias. Additional aspects include the one or more passive circuit components including a precision resistor, an inductor, a MIM capacitor, or a combination thereof. Further aspects include the one or more IC dies being mounted on the first or second side of the substrate assembly on one or more solder balls at the one or more metal-filled vias.

Aspects include a method including: forming one or more openings in a substrate by mechanical punching, laser drilling, or chemical etching, forming a conformal dielectric layer on all exposed surfaces of the substrate, filling the one or more openings with solder, W, Cu, Ti, Ag, or other metal-based paste to form one or more metal filled vias, forming a patterned metal layer on the conformal dielectric layer on one side of the substrate, forming an insulating layer on the one side of the substrate over the patterned metal layer, integrating one or more passive circuit components in the insulating layer on the patterned metal layer, forming one or more solder balls on another side of the substrate at the one or more metal-filled vias, and mounting one or more IC dies on the one or more solder balls, the one side and the another side corresponding to opposite surfaces of the substrate.

Additional aspects include forming the substrate from a carbon-based or metal-based material different from Si and FR4 and having a CTE matched to that of Si. Further aspects include forming the substrate by depositing alumina or a multilayer dielectric that has low permeability to oxygen and moisture on a paper substrate, by ALD.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A through 2I schematically illustrate an integration flow for a thin, flexible substrate, in accordance with an exemplary embodiment of the present disclosure; and FIGS. 3A through 3D schematically illustrate a squeegee operation, in accordance with an exemplary embodiment of the present disclosure.

DETAILED DESCRIPTION

Figure 1A:
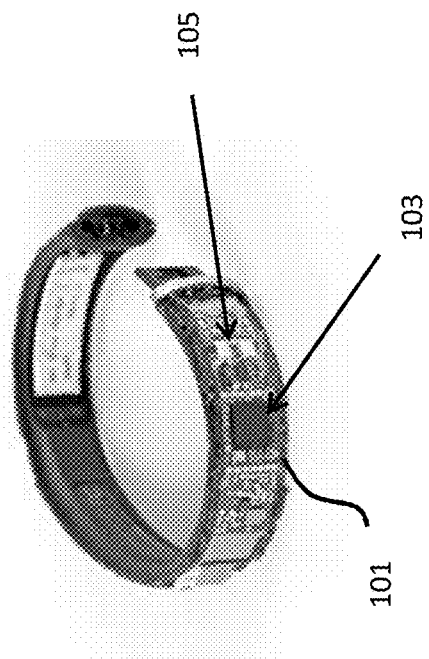
FIG. 1A illustrates a wearable device utilizing a conventional flex PCB substrate.
Figure 1B:
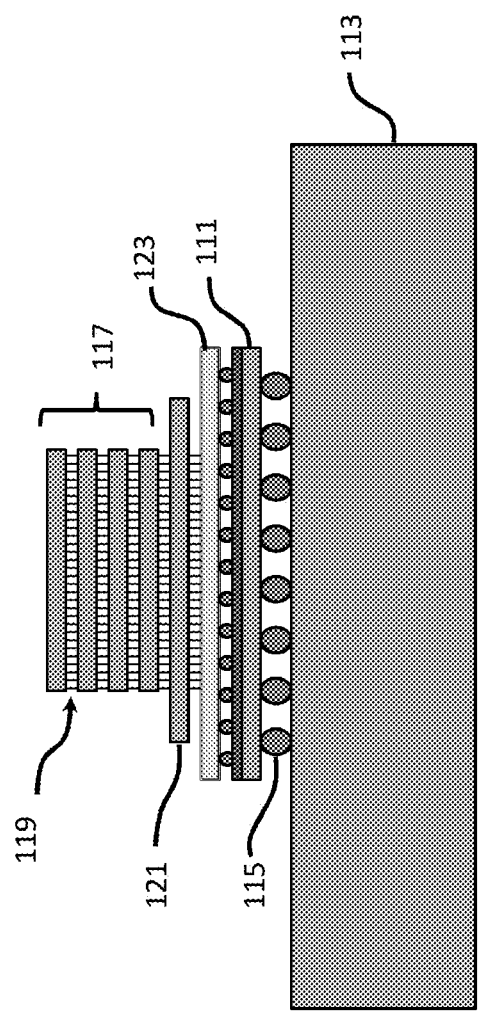
FIG. 1B schematically illustrates a conventional interposer assembly.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of large area, thickness, bulkiness, rigidity, and weight attendant upon FR4-based or polyimide-based PCB and associated electronic devices. The present disclosure also addresses and solves the current problem of cost, fragility, and bulkiness attendant upon Si-based interposer substrates and associated multi-chip packaging. In accordance with embodiments of the present disclosure, a thin, flexible, light weight, and smaller carbon-based or metal-based substrate is used. Also, in accordance with embodiments of the present disclosure, a thin, flexible, and carbon-based or metal-based substrate is used.

Methodology in accordance with embodiments of the present disclosure includes integrating one or more passive circuit components on a first surface of a substrate, and interconnecting one or more IC dies on the first or a second surface of the substrate to the one or more passive circuit components with one or more metal-filled vias between the first and second surfaces, the first and second surfaces being opposite surfaces of the substrate.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 2A through 2I schematically illustrate an integration flow for a flexible substrate, in accordance with an exemplary embodiment.

FIG. 2A illustrates a substrate 201. By way of example, substrate 201 may include a metal-based or carbon-based sheet having a thickness ranging from 25 to 300 μm. For instance, substrate 201 may be a stainless steel foil or paper. Other materials suitable for use as substrate 201 may include a variety of materials that have a CTE close to that of Si (3 ppm/° C.). For instance, Kovar® (29% Ni/17% Co/54% Fe with CTE 5.5 ppm/° C.), Invar® (36% Ni/64% Fe with CTE 1.2), other Ni—Fe based alloys (Ni content from 10% to 41% with CTE between 1 and 5.5 ppm/° C.), glass (borosilicate with CTE 3.3 ppm/° C.), paper (5 ppm/° C.), NILO® alloy 42 (42% Ni/58% Fe with CTE 4.5 ppm/° C.), and steel (Ferritic 4*** series with CTE 11) may be used. Matching the CTE to Si allows bare IC dies to attach directly to substrate 201 without causing temperature-cycling related reliability issues. Other materials suitable for use as substrate 201 may include Ti alloys, Cr, W, and high chromium iron.

Adverting to FIG. 2B, one or more openings 203 are formed in substrate 201. A variety of drilling techniques may be utilized, including mechanical punching, laser drilling, or chemical etching. The diameter of openings 203 may range from the sub-micron range through several hundred microns. A metallic substrate has further advantages of being able to spread any heat that may be generated by the electronic device effectively.

Figure 2C:
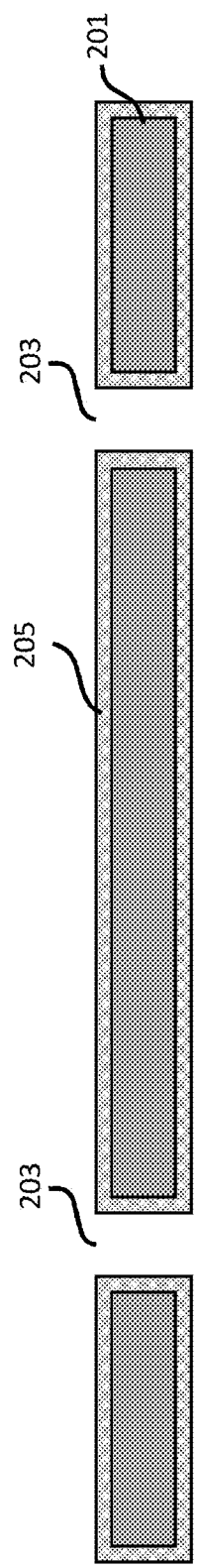

Adverting to FIG. 2C, dielectric layer 205 is conformally formed on all exposed surfaces of substrate 201, including surfaces in openings 203. By way of example, dielectric layer 205 is formed by ALD and has a thickness from 10 Å to 3 μm. The material used may include any material that has low permeability to oxygen and moisture. For instance, aluminum oxide ($Al_2O_3$), silicon dioxide ($SiO_2$), silicon nitride (SiN), other dielectrics or multi-layer dielectrics may be utilized. In addition, the material is a dielectric such that it provides electrical insulation between substrate 201 and any material formed on top of dielectric layer 205.

Figure 2D:
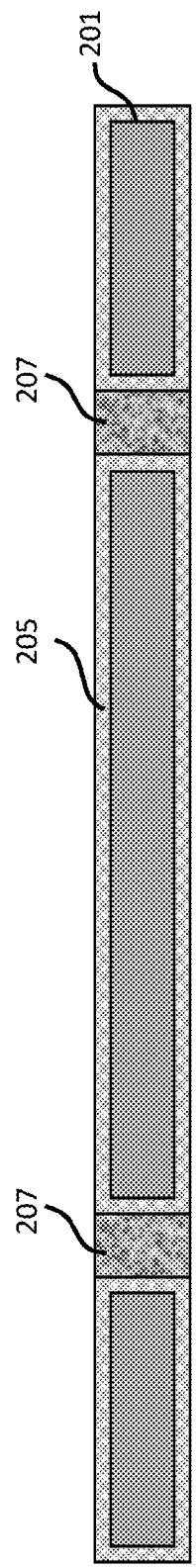
Figure 2I:
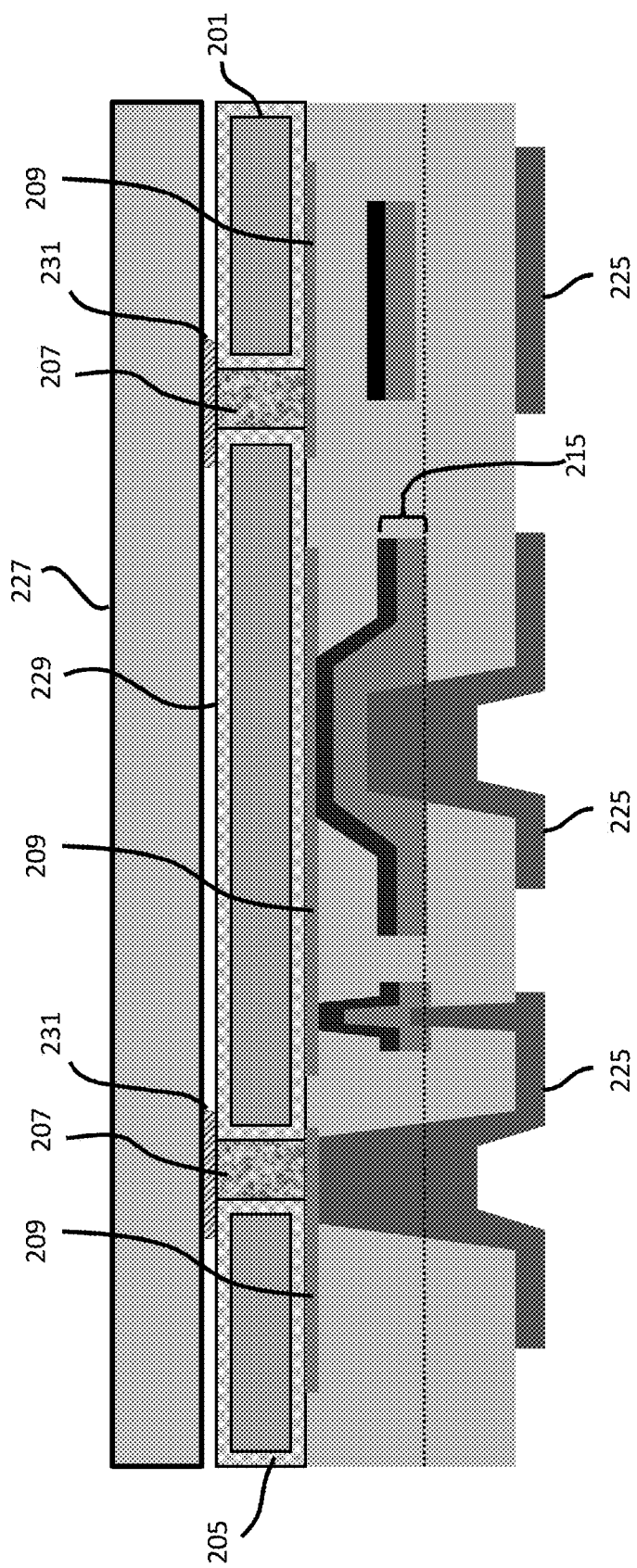

Adverting to FIG. 2D, metal-filled vias 207 are formed by filling openings 203 with an electrically conductive material. For example, solder, W, Cu, Ti, Ag, or other metal-containing pastes may be used. As described below in relation to FIGS. 3A through 3D, a variety of different methods may be used to fill openings 203, including using the perforated substrate 201 as a stencil in a squeegee operation. Other methods may include melt flowing and vacuum pulling at elevated temperatures. Metal-filled vias 207 may be used to interconnect devices on one side of substrate 201 to devices on the opposite side. Because substrate 201 is covered by dielectric layer 205, electrical signals may only be conducted through the metal-filled vias 207.

Adverting to FIG. 2E, metal layer 209 is formed and patterned on surface 211 of substrate 201. By way of example, metal layer 209 may be formed by plasma vacuum deposition (PVD) of Al, W, TiN, TiW, Ti, Cu, as well as other conductive materials to a thickness from 100 Å to 3 μm. As shown, metal layer 209 is formed directly over at least one metal-filled via 207 to cover the via. As discussed below, metal layer 209 interconnects devices formed on metal layer 209 to metal-filled vias 207.

Adverting to FIG. 2F, an insulating layer 213 is formed over metal layer 209 and surface 211 of substrate 201. By way of example, insulating layer 213 is formed by plasma enhanced chemical vapor deposition (PECVD) of $SiO_2$ to a thickness of 200 Å to 5 μm.

Adverting to FIG. 2G, passive circuit components 215 are formed in insulating layer 213 on metal layer 209. By way of example, insulating layer 213 is etched, $Al_2O_3$ or titanium oxide ($TiO_2$) is formed by ALD to form dielectric layer 217 to a thickness from 5 Å to 500 Å. Next, metal layer 219 is formed on dielectric layer 217. For instance, metal layer 219 may be formed by depositing TaN to a thickness from 400 Å to 2 μm. Passive circuit components 215 may include a precision resistor, an inductor, or a MIM capacitor. Thereafter, oxide 221 is deposited by PECVD to a thickness from 2000 Å from 3 μm. Finally, insulating layer 213 and oxide 221 are etched to form contact areas 223. Next, insulating layer 213 is etched and Al is deposited to form contacts 225 in contact areas 223 (FIG. 2H). Such etching of the dielectric may be performed to allow a via to electrically ground the metal-based substrate, exhibit lower capacitive losses, and provide better signal integrity. By way of example, Al is deposited to a thickness from 400 Å to 3 μm. Adverting to FIG. 2I, the assembly is flipped and IC die 227 is mounted on surface 229 of substrate 201 using solder balls 231 at metal-filled vias 207.

Conventional metal paste printing requires process conditions to be optimized. For instance, key process parameters include chamber pressure (preferably low), temperature (preferably elevated), the viscosity of the fill material (preferably low), and the size of the metal or other conductive particles used in the paste (preferably small). However, even after significant optimization of process conditions, conventional printing is limited to openings having aspect ratios 4:1 or less. Electro-plating is another metal filling technique, but requires handling of corrosive chemicals and may also require lithographic patterning. As described next, utilizing a substrate with openings as a stencil in conjunction with a mechanical squeegee operation allows for metal filling in openings having steep aspect ratios while avoiding complex processing.

FIGS. 3A through 3D schematically illustrate a double-sided solder fill of openings in a substrate, according to an exemplary embodiment of the present disclosure.

FIG. 3A illustrates substrate 301 with openings 303. For instance, substrate 301 is a thin metallic, paper, or other non-Si substrate with openings 303 created by mechanical punching, laser drilling, or chemical etching, as described in relation to FIG. 2C. As shown, squeegee 305 is positioned behind solder fill 307. Adverting to FIG. 3B, squeegee 305 is moved along surface 309 of substrate 301 from left to right. As shown, solder fill 307 is squeezed into openings 303 by the squeegee operation. By way of illustration, openings 303 operate as a stencil to retain a portion of solder fill 307. Adverting to FIG. 3C, substrate 301 is flipped such that surface 309 now faces downwards. Squeegee 305 is now positioned behind solder fill 307 deposited on the left side of surface 311. Adverting to FIG. 3D, squeegee 305 is moved along surface 311 from left to right. As shown, openings 303 are completely filled by the solder fill 307 after the squeegee operation completes.

The embodiments of the present disclosure can achieve several technical effects, including low cost, low thickness, thermally dissipative, electrically grounded or floating, flexible, substrates having a small form factor. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, a variety of wearable devices, IOT devices and digital cameras.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A method comprising:
  integrating one or more passive circuit components on a first surface of a substrate; and
  interconnecting one or more integrated circuit (IC) dies on a second surface of the substrate to the one or more passive circuit components with one or more metal-filled vias between the first and second surfaces,
wherein the first and second surfaces are opposite surfaces of the substrate, and
wherein the substrate is formed from a carbon-based material different from silicon (Si) and FR4 and which has a coefficient of thermal expansion (CTE) matched to that of Si, and by depositing alumina or a multilayer dielectric that has low permeability to oxygen and moisture on a paper substrate, by atomic layer deposition (ALD).

2. The method of claim 1, wherein the substrate has a CTE from 1 to 11 ppm/° C.

3. The method of claim 1, wherein the substrate has a thickness from 25 to 300 microns (μm).

4. The method of claim 1, further comprising:
forming one or more openings in the substrate;
forming a conformal dielectric layer on all exposed surfaces of the substrate; and
forming the one or more metal-filled vias by filling the one or more openings with solder, tungsten (W), copper (Cu), silver (Ag), titanium (Ti), or other metal-based paste.

5. The method of claim 4, comprising forming the one or more openings by mechanical punching, laser drilling, or chemical etching.

6. The method of claim 4, comprising filling the openings by:
performing a first squeegee operation over the first surface of the substrate; and
performing a second squeegee operation over the second surface of the substrate,
wherein the openings in the substrate are utilized as a stencil.

7. The method of claim 1, comprising integrating the one or more passive circuit components on the first surface of the substrate by:
patterning a metal layer formed on the first surface of the substrate;
forming an insulating layer on the patterned metal layer and on exposed surfaces of the first surface of the substrate; and
forming the one or more passive circuit components in the insulating layer at the patterned metal layer.

8. The method of claim 1, comprising mounting the one or more IC dies on the second surface of the substrate using one or more solder balls at the one or more metal-filled vias.

9. A method comprising:
forming one or more openings in a substrate by mechanical punching, laser drilling, or chemical etching;
forming a conformal dielectric layer on all exposed surfaces of the substrate;
filling the one or more openings with solder, tungsten (W), copper (Cu), titanium (Ti), silver (Ag) or other metal-based paste, to form one or more metal filled vias;
forming a patterned metal layer on the conformal dielectric layer on one side of the substrate;
forming an insulating layer on the one side of the substrate over the patterned metal layer;
integrating one or more passive circuit components in the insulating layer on the patterned metal layer;
forming one or more solder balls on another side of the substrate at the one or more metal-filled vias; and
mounting one or more integrated circuit (IC) dies on the one or more solder balls,
wherein the one side and the another side correspond to opposite surfaces of the substrate, and
wherein the substrate is formed by depositing alumina or other dielectric that has low permeability to oxygen and moisture on a paper substrate by atomic layer deposition (ALD).

10. The method of claim 9, comprising forming the substrate from a carbon-based material different from silicon (Si) and FR4 and having a coefficient of thermal expansion (CTE) matched to that of Si.

\* \* \* \* \*